United States Patent
Kabuyanagi et al.

(10) Patent No.: US 10,050,087 B1
(45) Date of Patent: Aug. 14, 2018

(54) SEMICONDUCTOR MEMORY DEVICE

(71) Applicant: TOSHIBA MEMORY CORPORATION, Minato-ku (JP)

(72) Inventors: Shoichi Kabuyanagi, Yokkaichi (JP); Masumi Saitoh, Yokkaichi (JP); Marina Yamaguchi, Yokkaichi (JP); Takashi Tachikawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/699,500

(22) Filed: Sep. 8, 2017

(30) Foreign Application Priority Data

Mar. 16, 2017 (JP) ................. 2017-050934

(51) Int. Cl.
*H01L 27/24* (2006.01)
*H01L 45/00* (2006.01)
*H01L 29/51* (2006.01)

(52) U.S. Cl.
CPC ........ *H01L 27/249* (2013.01); *H01L 27/2436* (2013.01); *H01L 29/517* (2013.01); *H01L 45/08* (2013.01); *H01L 45/1226* (2013.01); *H01L 45/1246* (2013.01); *H01L 45/146* (2013.01); *H01L 45/1608* (2013.01); *H01L 45/1253* (2013.01)

(58) Field of Classification Search
CPC ............... H01L 27/249; H01L 27/2472; H01L 27/2436; H01L 27/2454; H01L 45/145; H01L 45/146
See application file for complete search history.

(56) References Cited

U.S. PATENT DOCUMENTS

| 8,686,486 | B2 | 4/2014 | Kato et al. |
| 9,190,454 | B2 | 11/2015 | Saitoh et al. |
| 9,281,345 | B2 | 3/2016 | Kanno et al. |
| 2008/0149913 | A1 | 6/2008 | Tanaka et al. |
| 2014/0048761 | A1* | 2/2014 | Nojiri ............... H01L 45/146 257/2 |

(Continued)

FOREIGN PATENT DOCUMENTS

| JP | 2008-160004 A | 7/2008 |
| JP | 2011-233831 A | 11/2011 |
| JP | 2015-019048 A | 1/2015 |

(Continued)

*Primary Examiner* — Allison P Bernstein
(74) *Attorney, Agent, or Firm* — Oblon, McClelland, Maier & Neustadt, L.L.P.

(57) ABSTRACT

A semiconductor memory device according to an embodiment includes: a substrate having a surface extending in a first direction and a second direction intersecting the first direction; and a memory cell array disposed above the substrate, the memory cell array having: a first wiring line extending in the first direction; a second wiring line extending in a third direction intersecting the first and second directions; a third wiring line extending in the second direction; a memory cell including a first layer provided in an intersection region of the first wiring line and the second wiring line; and a select transistor including a channel layer provided between the second wiring line and the third wiring line, the first layer of the memory cell including a first material which is an oxide, and the channel layer of the select transistor including the first material.

13 Claims, 9 Drawing Sheets

(56) References Cited

U.S. PATENT DOCUMENTS

2015/0069320 A1* 3/2015 Rabkin ............ H01L 21/02403
257/5
2015/0213887 A1 7/2015 Ota et al.

FOREIGN PATENT DOCUMENTS

| JP | 2015-141726 A | 8/2015 |
| JP | 2016-208058 A | 12/2016 |

* cited by examiner

SEMICONDUCTOR MEMORY DEVICE

CROSS-REFERENCE TO RELATED APPLICATIONS

This application is based upon and claims the benefit of priority from the prior Japanese Patent Application No. 2017-050934, filed on Mar. 16, 2017, the entire contents of which are incorporated herein by reference.

BACKGROUND

Field

Embodiments of the present invention relate to a semiconductor memory device.

Description of the Related Art

In recent years, a resistance varying type memory that uses a two-terminal variable resistance element in its memory cell has been proposed as a technology for achieving miniaturization of the memory cell. Moreover, this resistance varying type memory makes it possible for a memory cell array of three-dimensional structure to be easily configured. Therefore, a large capacity file memory similar to a flash memory of three-dimensional structure can be achieved. On the other hand, due to manufacturing steps being complex, there is a problem that an obtained cost benefit is unclear compared to a three-dimensionally structured flash memory.

DETAILED DESCRIPTION

A semiconductor memory device according to an embodiment includes: a substrate having a surface extending in a first direction and a second direction extending the first direction; and a memory cell array disposed above the substrate, the memory cell array having: a first wiring line extending in the first direction; a second wiring line extending in a third direction intersecting the first and second directions; a third wiring line extending in the second direction; a memory cell including a first layer provided in an intersection region of the first wiring line and the second wiring line; and a select transistor including a channel layer provided between the second wiring line and the third wiring line, the first layer of the memory cell including a first material which is an oxide, and the channel layer of the select transistor including the first material.

Semiconductor memory devices according to embodiments will be described below with reference to the drawings.

First Embodiment

First, an overall configuration of a semiconductor memory device according to a first embodiment will be described.

Figure 1:
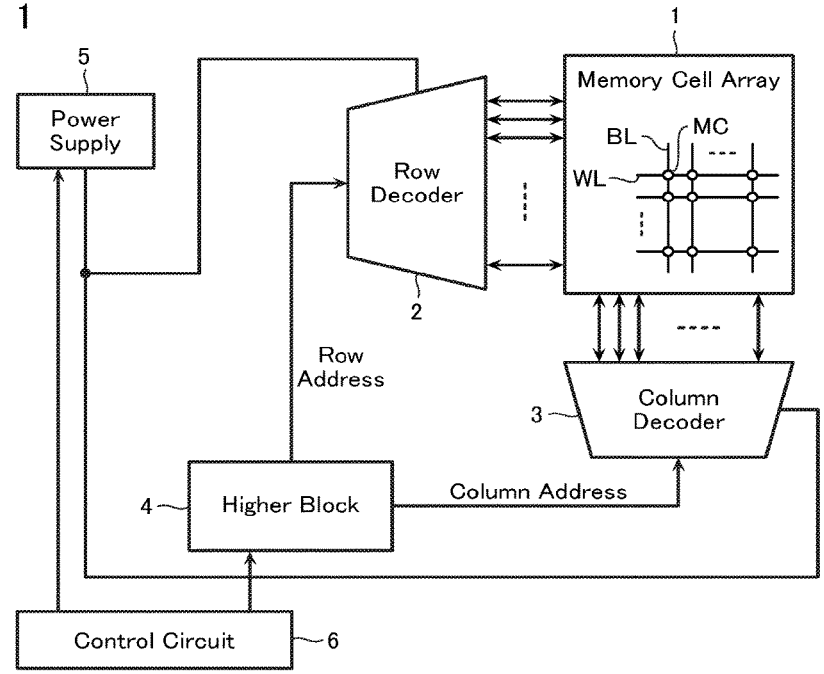
FIG. 1 is a view showing functional blocks of a semiconductor memory device according to a first embodiment.

FIG. 1 is a view showing functional blocks of the semiconductor memory device according to the present embodiment.

As shown in FIG. 1, the semiconductor memory device of the present embodiment includes a memory cell array 1, a row decoder 2, a column decoder 3, a higher block 4, a power supply 5, and a control circuit 6.

The memory cell array 1 includes: a plurality of word lines WL and a plurality of bit lines BL; and a plurality of memory cells MC selected by these word lines WL and bit lines BL. The row decoder 2 selects the word line WL during an access operation. The column decoder 3 selects the bit line BL during the access operation and includes a driver that controls the access operation. The higher block 4 selects the memory cell MC that will bean access target in the memory cell array 1. The higher block 4 assigns a row address and a column address to the row decoder 2 and the column decoder 3. The power supply 5, at a time of write/read of data, generates a certain combination of voltages corresponding to each of the operations, and supplies the certain combination of voltages to the row decoder 2 and the column decoder 3. The control circuit 6 sends an address to the higher block 4, and in addition, performs control of the power supply 5, based on a command from outside.

Next, an outline of the memory cell array 1 will be described.

Figure 2:
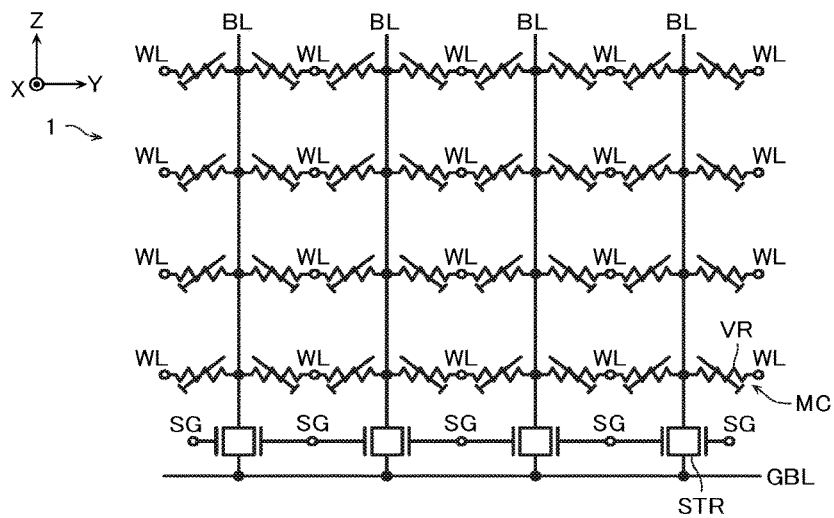
FIG. 2 is a circuit diagram of a memory cell array of the semiconductor memory device according to the same embodiment.

FIG. 2 is a circuit diagram of the memory cell array of the semiconductor memory device according to the present embodiment.

As shown in FIG. 2, the memory cell array 1 includes the plurality of word lines WL extending in an X direction, the plurality of bit lines BL extending in a Z direction, and the plurality of memory cells MC disposed in intersection regions of the plurality of word lines WL and the plurality of bit lines BL. In addition, the memory cell array 1 includes a plurality of global bit lines GBL. The bit lines BL arranged in a Y direction, of the plurality of bit lines BL, are commonly connected to one global bit line GBL via a select transistor STR. Each of the select transistors STR is controlled by a select gate line SG.

Next, a structure of the memory cell array 1 will be described. Note that hereafter, the memory cell array 1 of the present embodiment will be indicated by the symbol 100 in order to distinguish it from a memory cell array 1 of another embodiment.

Figure 3:
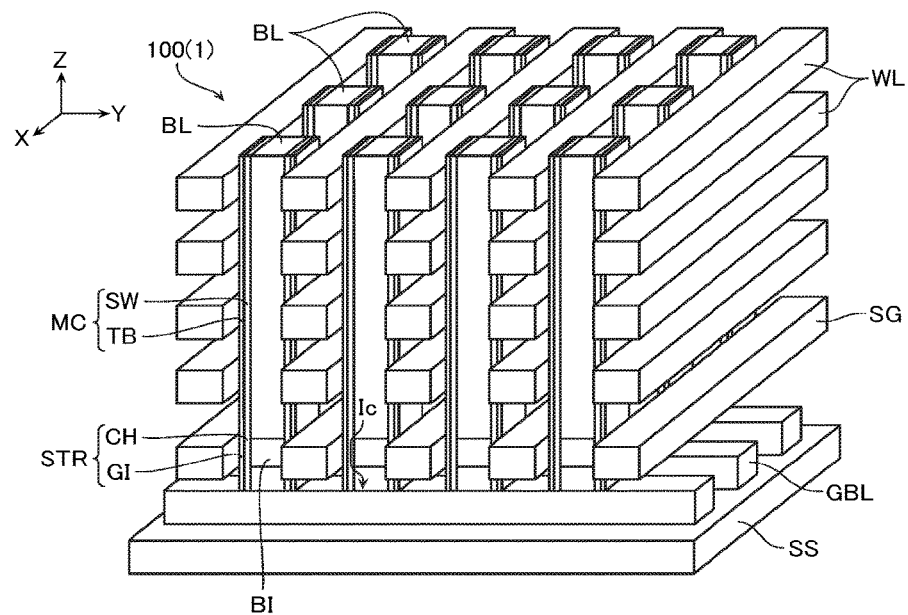
FIG. 3 is a perspective view of the memory cell array of the semiconductor memory device according to the same embodiment.

FIG. 3 is a perspective view of the memory cell array of the semiconductor memory device according to the present embodiment. Note that in FIG. 3, part of the configuration such as an interlayer insulating film between wiring lines is omitted.

As shown in FIG. 3, the memory cell array 100 has a structure in which the bit line BL extends perpendicularly to a principal plane of a semiconductor substrate SS. In other words, the plurality of word lines WL are arranged in a matrix in the Y direction and the Z direction, and each extend in the X direction. The plurality of bit lines BL are arranged in a matrix in the X direction and the Y direction, and extend in the Z direction. Moreover, each of the memory cells MC is disposed in each of the intersection regions of these plurality of word lines WL and plurality of bit lines BL. In other words, the plurality of memory cells MC are arranged in a three-dimensional matrix in the X direction, the Y direction, and the Z direction. Now, the word line WL is formed by titanium nitride (TiN) or tungsten (W), for example. The bit line BL is formed by titanium nitride (TiN) or polysilicon (Poly-Si), for example.

A plurality of the global bit lines GBL that are arranged in the X direction and extend in the Y direction are disposed between the semiconductor substrate SS and the plurality of bit lines BL. Moreover, the select transistor STR is disposed at each of lower ends of the plurality of bit lines BL. The select gate line SG that extends in the X direction is disposed between each of the select transistors STR adjacent in the Y direction. Now, the select gate line SG is formed by, for example, titanium nitride (TiN) or tungsten (W), similarly to the word line WL. In the case of FIG. 3, one select gate line SG controls a two row portion of select transistors STR arranged in the X direction straddling the select gate line SG in the Y direction. Note that it is also possible for one select gate line SG in FIG. 3 to be divided into left and right in the Y direction and for one row portions of the select transistors STR to each be individually controlled.

Next, the memory cell MC will be described.

As shown in FIG. 3, the memory cell MC of the present embodiment is configured by a switching layer SW and a tunnel barrier layer TB that are laminated in the Y direction between the bit line BL and the word line WL. Of these, the switching layer SW is formed having as its material a transition metal oxide including an oxygen deficiency, for example. On the other hand, the tunnel barrier layer TB is formed by a metal oxide which is a material having insulating properties. Note that when a half pitch of the word line WL has been set to 42 nm, the tunnel barrier layer TB, the switching layer SW, and the bit line BL are formed with film thicknesses of about 1-3 nm, 8-10 nm, and 16-24 nm, for example.

a resistance state of the memory cell MC undergoes transition by an access operation by voltage application. Now, the access operation includes: a setting operation where the memory cell MC in a high-resistance state is caused to undergo transition to a low-resistance state; and a resetting operation where the memory cell MC in the low-resistance state is caused to undergo transition to the high-resistance state.

The tunnel barrier layer TB is generally high resistance regardless of the resistance state of the memory cell MC. On the other hand, resistance of the switching layer SW changes according to a state of the oxygen deficiency on its inside. The resistance state at this time can be controlled by voltage application.

Figure 4:
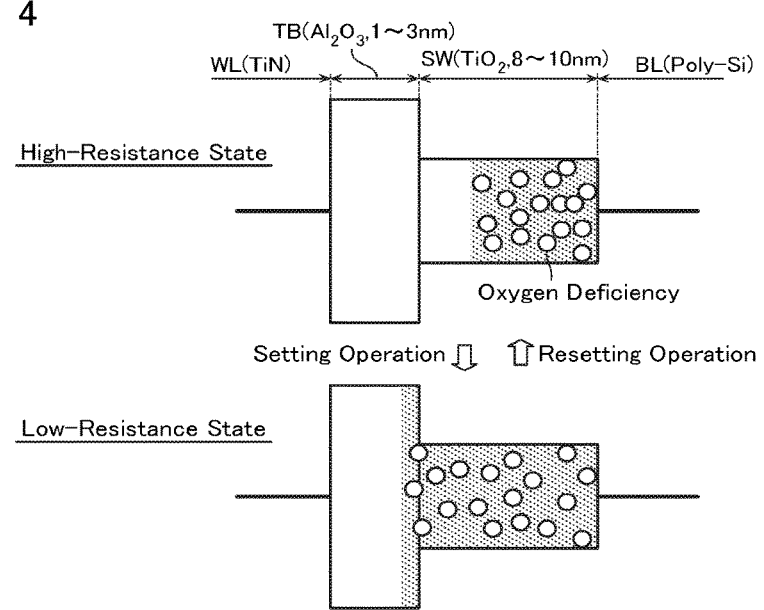
FIG. 4 is a view explaining an operating principle of a memory cell of the semiconductor memory device according to the same embodiment.

Furthermore, the resetting operation is executed on the memory cell MC in the low-resistance state. In the resetting operation, a certain resetting voltage having a different polarity to the setting voltage is applied to the memory cell MC via the word line WL and the bit line BL. This causes the oxygen deficiency of the switching layer SW to be biased to the bit line BL side. As a result, it becomes difficult for the current to flow in the switching layer SW, and resistance of the memory cell MC rises. In other words, the memory cell MC returns again to the high-resistance state, as shown in the upper view in FIG. 4.

Next, the select transistor STR will be described.

As shown in FIG. 3, the memory cell array 100 of the present embodiment includes an insulating layer BI between the word line WL and the global bit line GBL. Moreover, the select transistor STR is configured by a channel layer CH and a gate insulating layer GI that are laminated in the Y direction between this insulating layer BI and the word line WL. Of these, the channel layer CH forms a channel, depending on a potential of the select gate line SG. In other words, in the case of the present embodiment, as shown by an arrow in FIG. 3, a current Ic flowing between the memory cell MC and the global bit line GBL ends up detouring the insulating layer BI to flow along the channel layer CH.

Furthermore, in the case of the present embodiment, a structure of the channel layer CH of the select transistor STR is standardized with a structure of the switching layer SW of the memory cell MC, and a structure of the gate insulating layer GI of the select transistor STR is standardized with a structure of tunnel barrier layer TB of the memory cell MC. In other words, as shown in FIG. 3, the channel layer CH is formed by the same material as the switching layer SW of the memory cell MC and integrally with the switching layer SW of the memory cell MC. Similarly, the gate insulating layer GI also is formed by the same material as the tunnel barrier layer TB of the memory cell MC and integrally with the tunnel barrier layer TB of the memory cell MC. As will be mentioned later, standardizing the structures of the memory cell MC and the select transistor STR in this way makes it possible to simplify manufacturing steps of the memory cell array 100.

Note that in order for required specifications of both the memory cell MC and the select transistor STR to be provided, the switching layer SW (channel layer CH) and the tunnel barrier layer TB (gate insulating layer GI) must be formed by appropriate materials. For example, the switching layer SW can be formed from titanium oxide ($TiO_2$), zinc oxide (ZnO), indium oxide ($In_2O_3$) or the like which is a transition metal oxide and a semiconductor oxide. For example, the tunnel barrier layer TB can be formed from aluminum oxide ($Al_2O_3$), hafnium oxide ($HfO_2$), tantalum oxide ($Ta_2O_5$), zirconium oxide ($ZrO_2$) or the like which is a metal oxide and an insulator.

Next, manufacturing steps of the memory cell array 100 will be described.

FIGS. 5 to 13 are views explaining manufacturing steps of the memory cell array of the semiconductor memory device according to the present embodiment. These FIGS. 5 to 13 are schematic cross-sectional views of part of the memory cell array 100 cut in the Y-Z directions.

Figure 5:
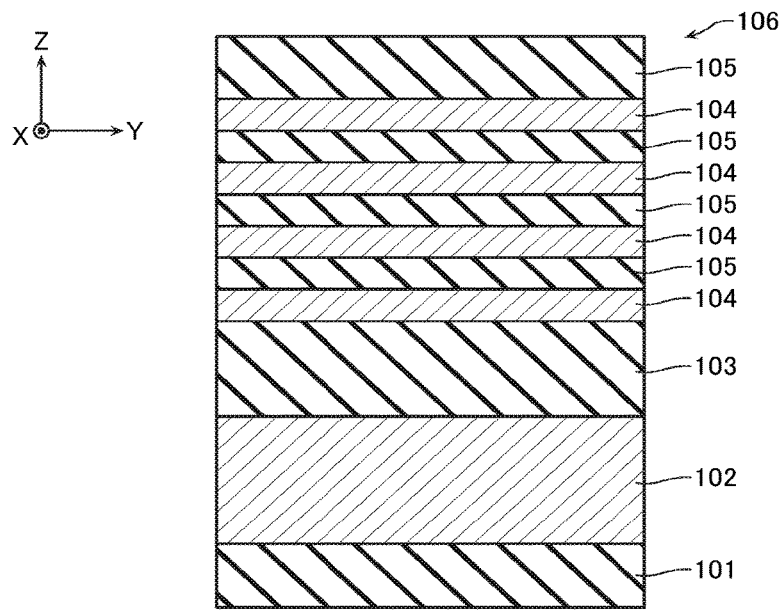
FIG. 5 is a view explaining a manufacturing step of the memory cell array of the semiconductor memory device according to the same embodiment.

First, the global bit line GBL is formed on the semiconductor substrate SS. Then, an interlayer insulating layer 101 is laminated on the global bit line GBL. Then, a conductive layer 102 that will be the select gate line SG is laminated on the interlayer insulating layer 101. Then, an interlayer insulating layer 103 is laminated on the conductive layer 102. Then, a conductive layer 104 that will be the word line WL and an interlayer insulating layer 105 are repeatedly laminated, alternately, up to a desired number, on the interlayer insulating layer 103. Now, the interlayer insulating layers 101, 103, and 105 are formed having, for example, silicon oxide ($SiO_2$) as their material. The conductive layers 102 and 104 are formed having, for example, titanium nitride (TiN) or tungsten (W) as their material. In the step so far, a laminated body 106 including the interlayer insulating layer 101, the conductive layer 102, the interlayer insulating layer 103, a plurality of the conductive layers 104, and a plurality of the interlayer insulating layers 105, shown in FIG. 5, is formed.

Figure 6:
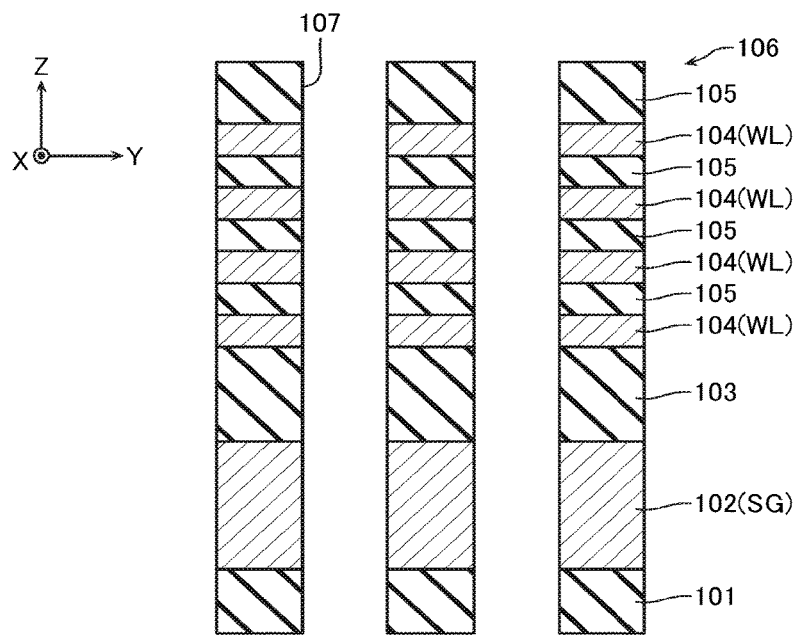
FIG. 6 is a view explaining a manufacturing step of the memory cell array of the semiconductor memory device according to the same embodiment.

Then, as shown in FIG. 6, a trench 107 having the X direction as its extension direction and having the Z direction as its depth direction is formed from an upper surface of the uppermost layer interlayer insulating layer 105 to a lower surface of the interlayer insulating layer 101, in the laminated body 106, by anisotropic etching. In the step so far, the conductive layer 102 becomes the select gate line SG extending in the X direction. Moreover, the conductive layer 104 also becomes the word line WL extending in the X direction.

Figure 7:
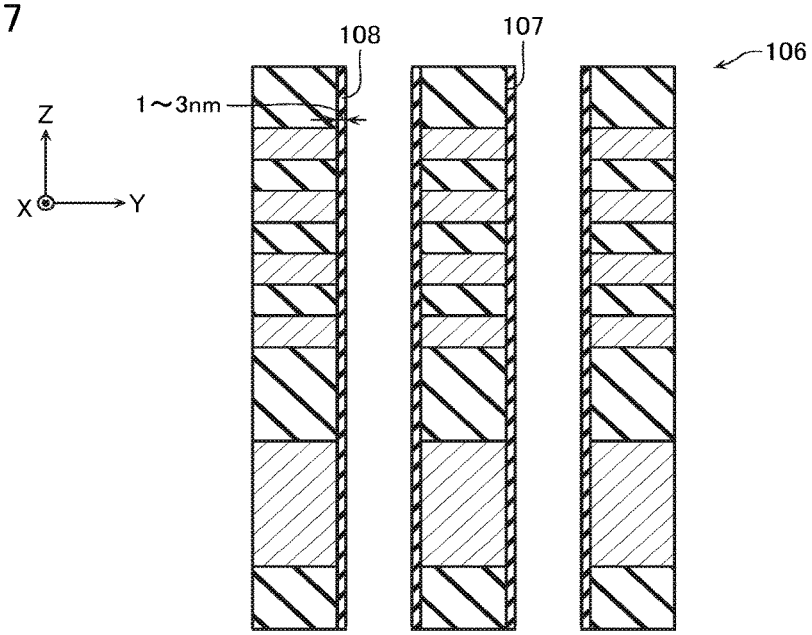
FIG. 7 is a view explaining a manufacturing step of the memory cell array of the semiconductor memory device according to the same embodiment.

Then, as shown in FIG. 7, an insulating layer 108 that will be the tunnel barrier layer TB and the gate insulating layer GI is deposited with a film thickness of about 1-3 nm on a side surface of the trench 107. Now, the insulating layer 108 is formed from material such as aluminum oxide ($Al_2O_3$), hafnium oxide ($HfO_2$), tantalum oxide ($Ta_2O_5$), zirconium oxide ($ZrO_2$) or the like which is a metal oxide and an insulator, for example.

Figure 8:
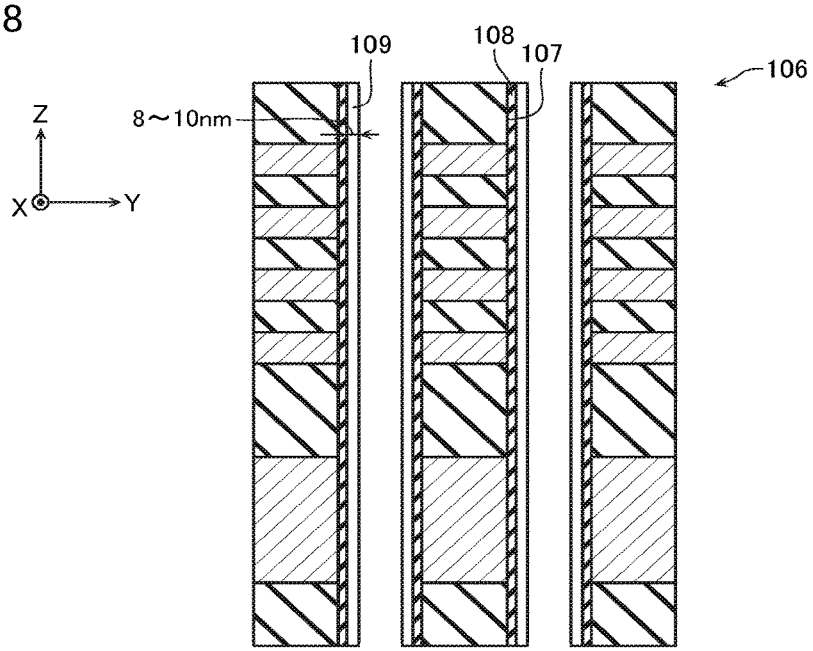
FIG. 8 is a view explaining a manufacturing step of the memory cell array of the semiconductor memory device according to the same embodiment.

Then, as shown in FIG. 8, an oxide layer 109 that will be the channel layer CH and the switching layer SW is deposited with a film thickness of about 8-10 nm on the side surface of the trench 107 where the insulating layer 108 has been deposited. Now, the oxide layer 109 is formed from material such as titanium oxide ($TiO_2$), zinc oxide (ZnO), indium oxide ($In_2O_3$) or the like which is a transition metal oxide and semiconductor oxide, for example. Note that, for example, annealing treatment at 500° C.-700° C. is employed in deposition of the insulating layer 108 and the oxide layer 109.

Figure 9:
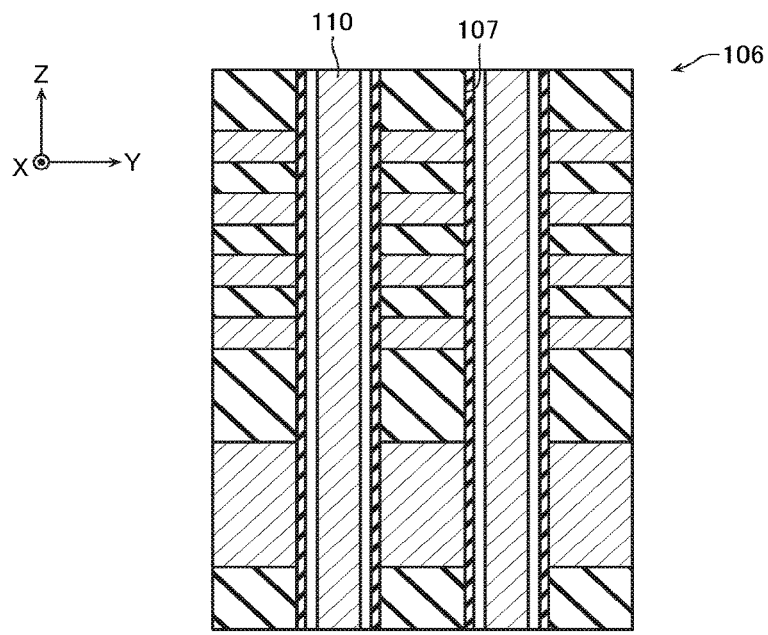
FIG. 9 is a view explaining a manufacturing step of the memory cell array of the semiconductor memory device according to the same embodiment.

Then, as shown in FIG. 9, a conductive layer 110 is implanted in the trench 107 by the likes of chemical vapor deposition (CVD: Chemical Vapor Deposition). Now, the conductive layer 110 is formed having, for example, polysilicon (Poly-Si) as its material.

Figure 10:
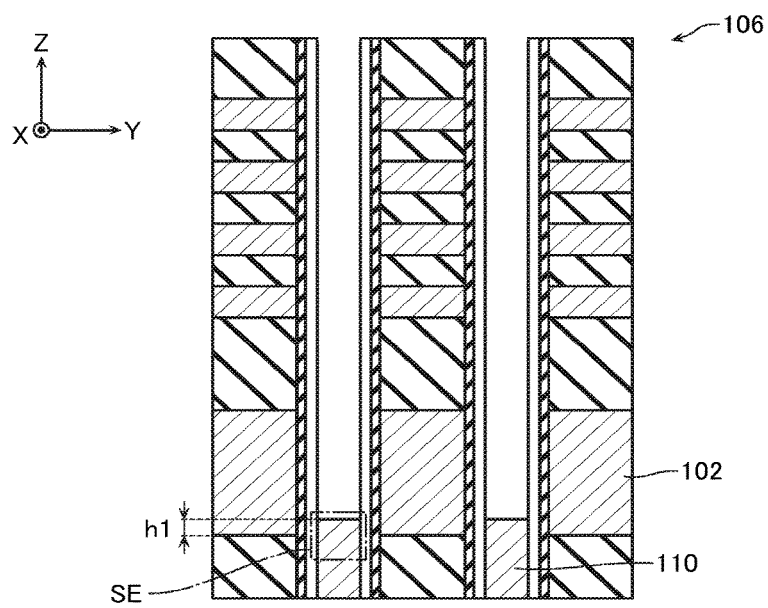
FIG. 10 is a view explaining a manufacturing step of the memory cell array of the semiconductor memory device according to the same embodiment.

Then, as shown in FIG. 10, the conductive layer 110 is etched back, by the likes of wet etching, until an upper surface of the conductive layer 110 becomes lower than at least an upper surface of the conductive layer 102 in the Z direction.

Now, an upper section of the conductive layer 110 is a portion functioning as a source electrode SE of the select transistor STR. In other words, offset between a gate electrode (select gate line SG) and the source electrode SE of the select transistor STR depends on a position of the upper surface of the conductive layer 110. Moreover, magnitudes of on current and off-leak current of the select transistor STR are determined by magnitude of this offset. For example, when, as shown in FIG. 10, the upper section of the conductive layer 110 has been disposed so as to overlap the conductive layer 102 in the Z direction (refer to h1 in FIG. 10), the offset between the gate electrode and the source electrode SE becomes small, hence, relatively, the on current and the off-leak current become large. On the other hand, if the upper surface of the conductive layer 110 is etched back until it becomes lower than a lower surface of the conductive layer 102 and the upper section of the conductive layer 110 is disposed so as not to overlap the conductive layer 102 in the Z direction, the offset between the gate electrode and the source electrode SE becomes large, hence, relatively, the on current and the off-leak current become small. In other words, if an amount of etching back of the conductive layer 110 is adjusted, the on current and the off-leak current of the select transistor STR can be adjusted.

Figure 11:
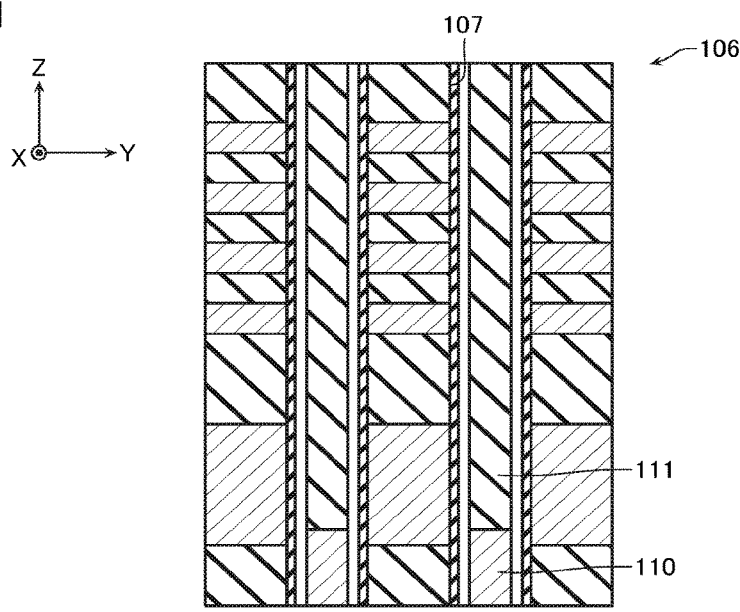
FIG. 11 is a view explaining a manufacturing step of the memory cell array of the semiconductor memory device according to the same embodiment.

Then, as shown in FIG. 11, an insulating layer 111 that will be the insulating layer BI is implanted in the trench 107 where the conductive layer 110 has been implanted. Now, the insulating layer 111 is formed having, for example, silicon oxide ($SiO_2$) as its material.

Figure 12:
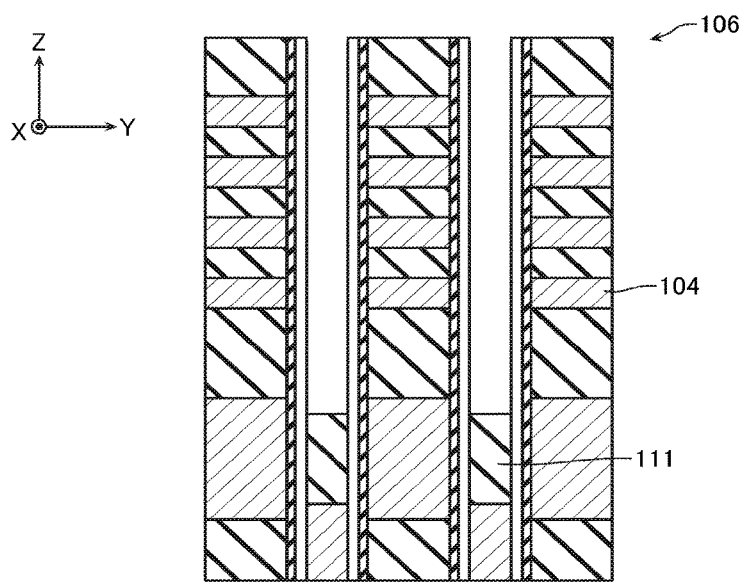
FIG. 12 is a view explaining a manufacturing step of the memory cell array of the semiconductor memory device according to the same embodiment.

Then, as shown in FIG. 12, the insulating layer 111 is etched back, by the likes of wet etching, until an upper surface of the insulating layer 111 becomes lower than at least a lower surface of the lowermost layer conductive layer 104 in the Z direction.

Figure 13:
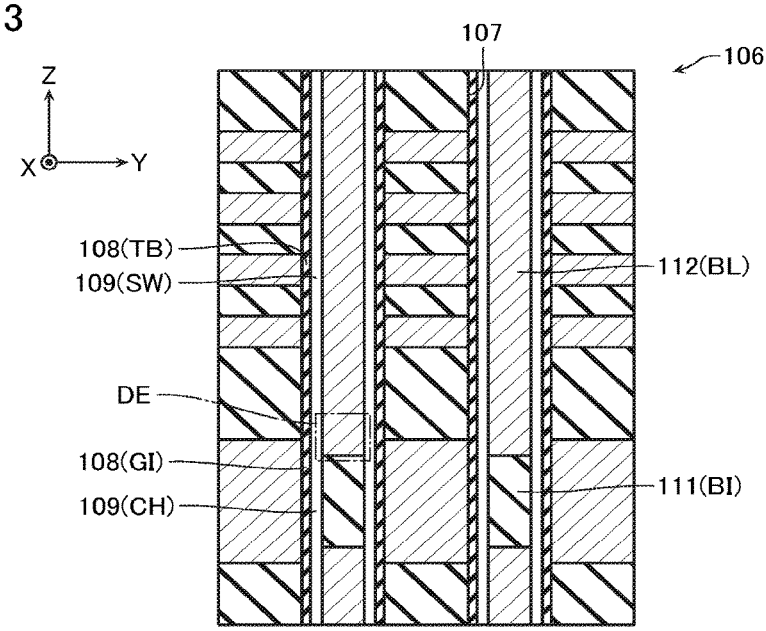
FIG. 13 is a view explaining a manufacturing step of the memory cell array of the semiconductor memory device according to the same embodiment.

Then, as shown in FIG. 13, a conductive layer 112 that will be the bit line BL is implanted in the trench 107 where the insulating layer 111 has been implanted.

Now, a lower section of the conductive layer 112 is a portion functioning as a drain electrode DE of the select transistor STR, similarly to the upper section of the conductive layer 110. Therefore, similarly to in the conductive layer 110, offset between the gate electrode (select gate line SG) and the drain electrode DE of the select transistor STR depends on a position of a lower surface of the conductive layer 112. In other words, adjusting an amount of etching back of the insulating layer 111 in the previous step shown in FIG. 12 makes it possible to adjust the on current and off-leak current of the select transistor STR.

Then, a trench (not illustrated) dividing the insulating layer 108, the oxide layer 109, the conductive layer 110, the insulating layer 111, and the conductive layer 112 in the X direction is formed by the likes of wet etching. In the step so far, the insulating layer 108 becomes the tunnel barrier layer TB and the gate insulating layer GI. The oxide layer 109 becomes the switching layer SW and the channel layer CH. The insulating layer 111 becomes the insulating layer BI. Moreover, the conductive layer 112 becomes the bit line BL. Finally, when an insulating layer is implanted in this trench, the memory cell array 100 shown in FIG. 3 is formed.

That concludes manufacturing steps of the memory cell array 100.

Next, advantages of the memory cell array 100 of the present embodiment will be described using a comparative example. In the comparative example used here, a structure of the select transistor differs from that of the memory cell array 100. Specifically, a channel layer is disposed in a position of the insulating layer BI of the memory cell array 100, and only a gate insulating layer configured from silicon oxide ($SiO_2$) is disposed between this channel layer and the select gate line. In other words, the comparative example has a structure in which the switching layer and the tunnel barrier layer of the memory cell are laminated on the gate insulating layer of the select transistor by materials different from that of this gate insulating layer and discontinuously.

In manufacturing steps of the memory cell array of the above-described comparative example, first, a first laminated body in which a conductive layer that will be the source electrode, the channel layer, and a conductive layer that will be the drain electrode are laminated, is formed on the semiconductor substrate. Then, lithography is employed to form a first trench in the first laminated body. Then, the select gate line is formed in the first trench. Then, a second laminated body in which a plurality of interlayer insulating layers and conductive layers that will be the word lines are alternately laminated, is formed above these. Then, lithography is employed to form a second trench in the second laminated body, at a position between the first trenches of the first laminated body. Then, the tunnel barrier layer and the switching layer are sequentially deposited on a side surface of this second trench, after which a conductive layer that will be the bit line is implanted in the second trench.

Due to the above-described manufacturing steps of the comparative example, the structures of the memory cell and the select transistor have not been standardized, and it has been necessary for the select transistor and the memory cell to be formed in stages. In this case, it becomes a problem that the number of times of lithography steps or film depositions increases.

In this respect, in the case of the present embodiment, the switching layer SW of the memory cell MC and channel layer CH of the select transistor STR and the tunnel barrier layer TB of the memory cell MC and gate insulating layer GI of the select transistor STR are respectively formed by the same material and respectively have an integrated structure. Therefore, in the case of the memory cell array 100, the above-described two times of lithography steps in the comparative example can be executed unified into one time. Moreover, as a result, a reduction in the number of times of film depositions, and omission of a doping process for formation of a source/drain region of the select transistor STR, are also enabled.

In other words, the semiconductor memory device according to the present embodiment makes it possible to achieve a significant reduction in manufacturing cost by simplification of the manufacturing steps.

Second Embodiment

Here, a second embodiment will be described mainly regarding points that differ from in the first embodiment. Note that hereafter, the memory cell array 1 of the present embodiment will be indicated by the symbol 200 in order to distinguish it from a memory cell array 1 of another embodiment.

First, a structure of the memory cell array 200 will be described.

Figure 14:
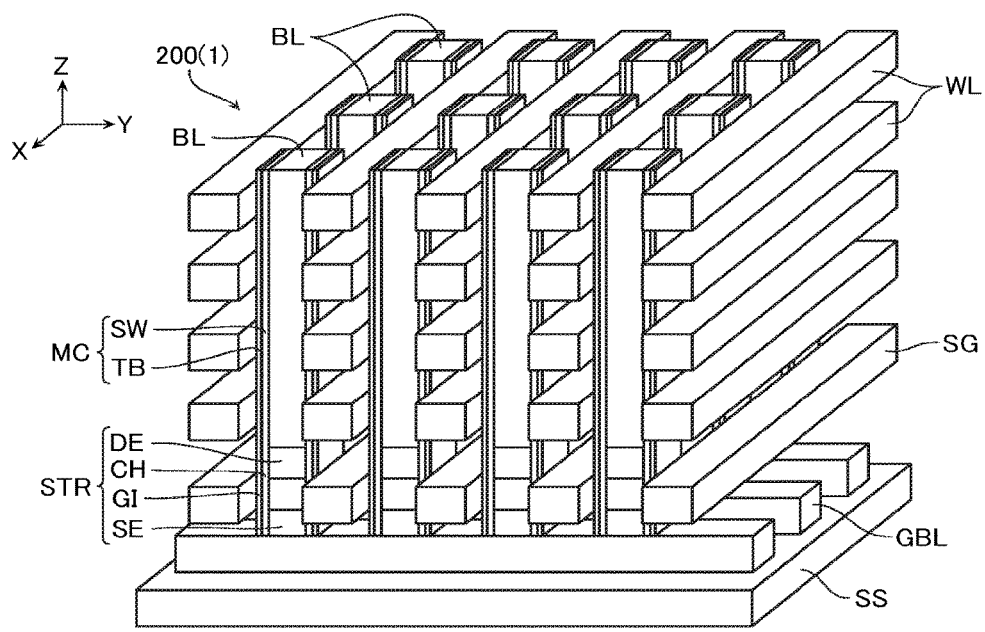
FIG. 14 is a perspective view showing a schematic structure of a memory cell array of a semiconductor memory device according to a second embodiment.

FIG. 14 is a perspective view of the memory cell array of a semiconductor memory device according to the present embodiment. Note that in FIG. 14, part of the configuration such as an interlayer insulating film between wiring lines is omitted.

In the memory cell array 200, contrary to in the memory cell array 100, a conductive layer formed by a material having a smaller electronegativity than the material of the bit line BL is interposed above and below the insulating layer BI. These conductive layers function as the source electrode SE and the drain electrode DE of the select transistor STR.

Now, the bit line BL is formed by a conductive material whose electronegativity is comparatively large such as silver (Ag), copper (Cu), ruthenium (Ru), palladium (Pd), platinum (Pt) or gold (Au), for example, in addition to polysilicon. Moreover, the source electrode SE and the drain electrode DE are formed by a conductive material whose electronegativity is comparatively small such as aluminum (Al), titanium (Ti), niobium (Nb), chromium (Cr), tungsten (W), iron (Fe), molybdenum (Mo), cobalt (Co), or nickel (Ni), for example.

Next, manufacturing steps of the memory cell array 200 will be described.

Figure 15:
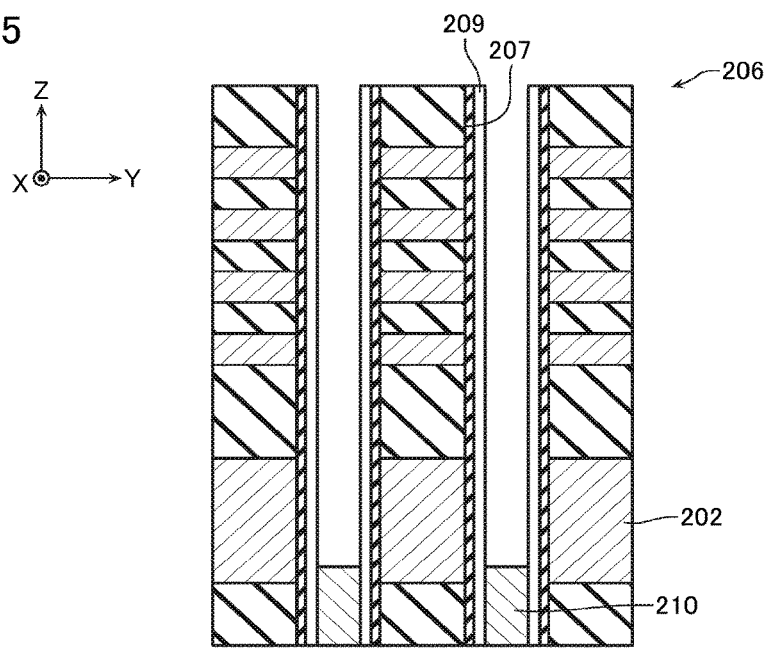
FIG. 15 is a view explaining a manufacturing step of the memory cell array of the semiconductor memory device according to the same embodiment.
Figure 16:
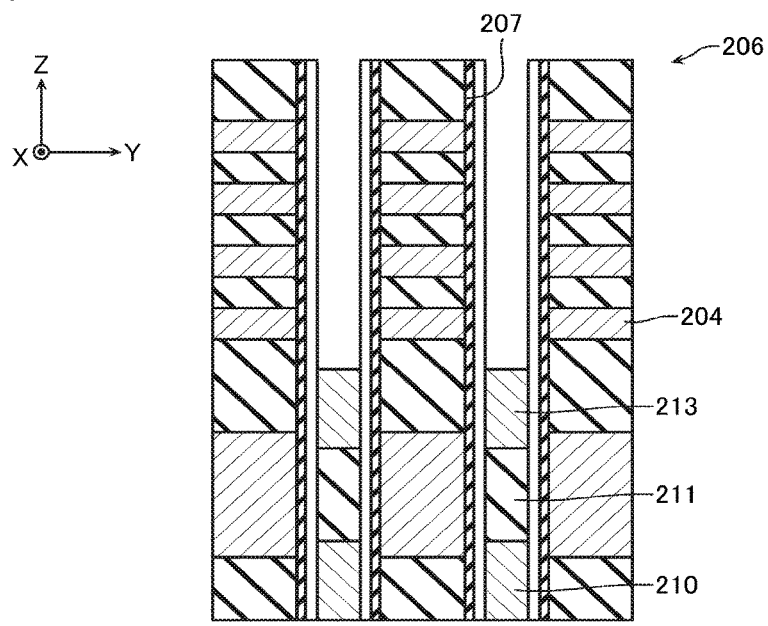
FIG. 16 is a view explaining a manufacturing step of the memory cell array of the semiconductor memory device according to the same embodiment.
Figure 17:
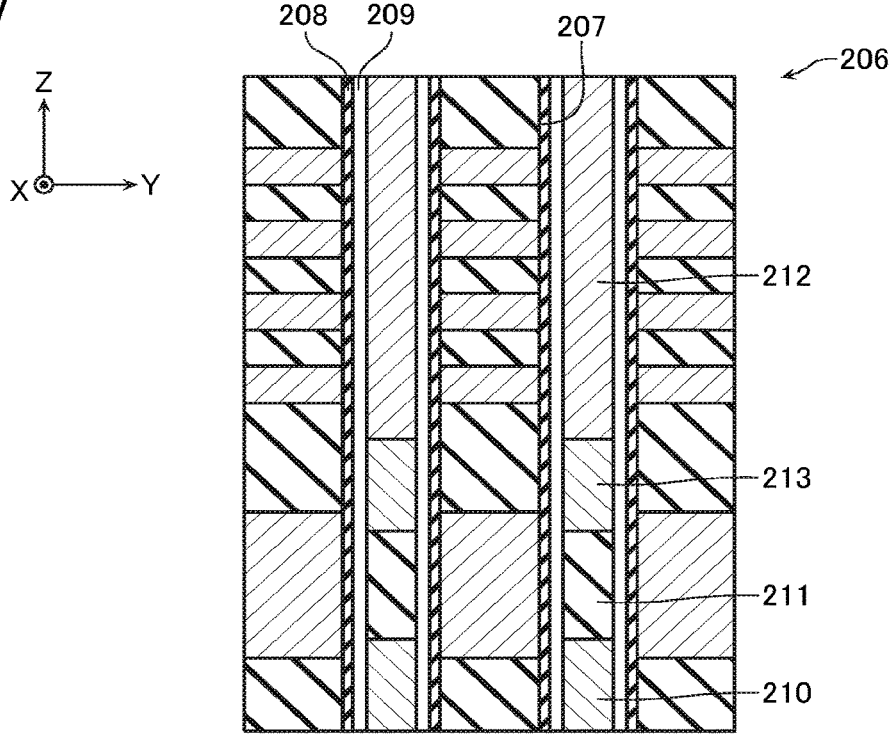
FIG. 17 is a view explaining a manufacturing step of the memory cell array of the semiconductor memory device according to the same embodiment.

FIGS. 15 to 17 are views explaining manufacturing steps of the memory cell array of the semiconductor memory device according to the present embodiment. These FIGS. 15 to 17 are schematic cross-sectional views of part of the memory cell array 200 cut in the Y-Z directions.

First, from formation of a laminated body 206 (corresponding to the laminated body 106) on the global bit line GBL to deposition of an oxide layer 209 (corresponding to the oxide layer 109) is executed similarly to in the manufacturing steps of the memory cell array 100.

Then, a conductive layer 210 that will be the source electrode SE is deposited in a trench 207 (corresponding to the trench 107). Now, the conductive layer 210 is formed by a conductive material having an electronegativity which is smaller than that of the material of the bit line BL, for example, aluminum (Al). Then, as shown in FIG. 15, the conductive layer 210 is etched back, by the likes of wet etching, until an upper surface of the conductive layer 210 becomes lower than at least an upper surface of a conductive layer 202 in the Z direction.

Then, similarly to in the manufacturing steps of the memory cell array 100, an insulating layer 211 (corresponding to the insulating layer 111) is implanted in the trench 207 where the conductive layer 210 has been implanted.

Then, a conductive layer 213 that will be the drain electrode DE is implanted in the trench 207 where the insulating layer 211 has been implanted. Now, the conductive layer 213 is formed by a conductive material having an electronegativity which is smaller than that of the material of the bit line BL, for example, aluminum (Al). The material of this conductive layer 213 may be the same as or different from that of the conductive layer 210. Then, as shown in FIG. 16, the conductive layer 213 is etched back, by the likes of wet etching, until an upper surface of the conductive layer 213 becomes lower than at least a lower surface of the lowermost layer conductive layer 204 (corresponding to the lowermost layer conductive layer 104) in the Z direction.

Then, as shown in FIG. 17, a conductive layer 212 (corresponding to the conductive layer 112) that will be the bit line BL is implanted in the trench 207 where the conductive layer 213 has been implanted. Now, the conductive layer 212 is formed by a material having an electronegativity which is larger than that of the materials of the conductive layers 210 and 213, for example, silver (Ag).

Finally, similarly to in the manufacturing steps of the memory cell array 100, when a trench (not illustrated)

dividing the insulating layer 208, the oxide layer 209, the conductive layer 210, the insulating layer 111, and the conductive layers 112 and 213 in the X direction is formed and an insulating layer is implanted in this trench, the memory cell array 200 shown in FIG. 14 is formed.

That concludes manufacturing steps of the memory cell array 200.

Next, advantages of the memory cell array 200 of the present embodiment will be described.

Employing a material of small electronegativity in the source electrode SE and the drain electrode DE causes an ohmic junction to be made between the source electrode SE and drain electrode DE and the channel layer CH of the select transistor STR. As a result, contact resistances of these decrease. On the other hand, because a material of large electronegativity is employed in the bit line BL, rectification due to a Schottky junction is secured between the bit line BL and the switching layer SW.

From the above, the semiconductor memory device according to the present embodiment makes it possible not only for similar advantages to those of the first embodiment to be obtained, but also to achieve an improvement in characteristics of the select transistor STR and the memory cell MC compared to in the first embodiment.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a substrate comprising a surface extending in a first direction and a second direction intersecting the first direction; and
   a memory cell array disposed above the substrate, the memory cell array comprising: a first wiring line extending in the first direction; a second wiring line extending in a third direction intersecting the first and second directions; a third wiring line extending in the second direction; a memory cell comprising a first layer and provided in an intersection region of the first wiring line and the second wiring line; a select transistor including a channel layer and provided between the second wiring line and the third wiring line; and an insulating layer disposed between an end of the second wiring line in the third direction and the third wiring line,
   wherein
   the first layer of the memory cell comprises a first material which is an oxide,
   the channel layer of the select transistor comprises the first material
   the memory cell further comprises a second layer,
   the select transistor further comprises a gate insulating layer,
   the second layer of the memory cell comprises a second material which is an insulating material,
   the gate insulating layer of the select transistor comprises the second material, and
   the channel layer is disposed between the gate insulating layer and the insulating layer.

2. The semiconductor memory device according to claim 1, wherein the first material is a transition metal oxide.

3. The semiconductor memory device according to claim 1, wherein
   the first material is a semiconductor oxide, the semiconductor oxide comprising at least one of titanium oxide, zinc oxide, or indium oxide.

4. The semiconductor memory device according to claim 1, wherein positions of at least one of a source electrode or a drain electrode of the select transistor and a gate electrode of the select transistor in the third direction are partially overlapped.

5. A semiconductor memory device, comprising:
   a substrate comprising a surface extending in a first direction and a second direction intersecting the first direction; and
   a memory cell array disposed above the substrate, the memory cell array comprising: a first wiring line extending in the first direction, a second wiring line extending in a third direction intersecting the first and second directions; a third wiring line extending in the second direction; a memory cell comprising a first layer and provided in an intersection region of the first wiring line and the second wiring line; and a select transistor comprising a channel layer and provided between the second wiring line and the third wiring line,
   wherein
   the first layer of the memory cell comprises a first material which is an oxide,
   the channel layer of the select transistor comprises the first material,
   the memory cell further comprises a second layer,
   the select transistor further comprises a gate insulating layer,
   the second layer of the memory cell comprises a second material which is an insulating material,
   the gate insulating layer of the select transistor comprises the second material, and
   the second material comprises at least one of aluminum oxide, hafnium oxide, tantalum oxide, or zirconium oxide.

6. A semiconductor memory device, comprising:
   a substrate comprising a surface extending in a first direction and a second direction intersecting the first direction; and
   a memory cell array disposed above the substrate, the memory cell array comprising: a first wiring line extending in the first direction, a second wiring line extending in a third direction intersecting the first and second directions, a third wiring line extending in the second direction; a memory cell comprising a first layer and provided in an intersection region of the first wiring line and the second wiring line; and a select transistor comprising a channel layer and provided between the second wiring line and the third wiring line, wherein
   the first layer of the memory cell comprises a first material which is an oxide,
   the channel layer of the select transistor comprises the first material,
   the second wiring line comprises a third material which is a conductive material, and
   at least one of a source electrode or a drain electrode of the select transistor comprises a fourth material, the fourth material being a conductive material and having an electronegativity which is different from that of the third material.

7. The semiconductor memory device according to claim 6, wherein the fourth material has an electronegativity which is smaller than that of the third material.

8. A semiconductor memory device, comprising:
a memory cell array disposed above a substrate, the memory cell array comprising: a first wiring line and a second wiring line that intersect each other; a third wiring line; a memory cell comprising a first layer and provided in an intersection region of the first wiring line and the second wiring line; a select transistor comprising a channel layer and provided between the second wiring line and the third wiring line; and an insulating layer disposed between an end of the second wiring line and the third wiring line,
wherein
the first layer of the memory cell comprises a first material which is an oxide,
the channel layer of the select transistor comprises the first material
the memory cell further comprises a second layer,
the select transistor further comprises a gate insulating layer,
the second layer of the memory cell comprises a second material which is an insulating material,
the gate insulating layer of the select transistor comprises the second material, and
the channel layer is disposed between the gate insulating layer and the insulating layer.

9. The semiconductor memory device according to claim 8, wherein the first material is a transition metal oxide.

10. The semiconductor memory device according to claim 8, wherein the first material is at least one of titanium oxide, zinc oxide, or indium oxide.

11. A semiconductor memory device, comprising:
a memory cell array disposed above a substrate, the memory cell array comprising: a first wiring line and a second wiring line that intersect each other; a third wiring line; a memory cell comprising a first layer and provided in an intersection region of the first wiring line and the second wiring line; and a select transistor comprising a channel layer and provided between the second wiring line and the third wiring line,
wherein
the first layer of the memory cell comprises a first material which is an oxide,
the channel layer of the select transistor comprises the first material,
the memory cell further comprises a second layer,
the select transistor further comprises a gate insulating layer,
the second layer of the memory cell comprises a second material which is an insulating material,
the gate insulating layer of the select transistor comprises the second material, and
the second material is at least one of aluminum oxide, hafnium oxide, tantalum oxide, or zirconium oxide.

12. The A semiconductor memory device, comprising:
a memory cell array disposed above a substrate, the memory cell array comprising: a first wiring line and a second wiring line that intersect each other; a third wiring line; a memory cell comprising a first layer and provided in an intersection region of the first wiring line and the second wiring line; and a select transistor comprising a channel layer and provided between the second wiring line and the third wiring line,
wherein
the first layer of the memory cell comprises a first material which is an oxide,
the channel layer of the select transistor comprises the first material,
the second wiring line comprises a third material which is conductive material, and
at least one of a source electrode or a drain electrode of the select transistor comprises a fourth material, the fourth material being conductive material and having an electronegativity which is different from that of the third material.

13. The semiconductor memory device according to claim 12, wherein the fourth material has an electronegativity which is smaller than that of the third material.

* * * * *